(12) United States Patent
Hatano et al.

(10) Patent No.: US 11,246,245 B2
(45) Date of Patent: Feb. 8, 2022

(54) CAMERA

(71) Applicant: Panasonic Intellectual Property Management Co., Ltd., Osaka (JP)

(72) Inventors: Toshinobu Hatano, Kanagawa (JP); Kazufumi Takeshita, Tokyo (JP); Ken Nakamura, Kanagawa (JP); Yasuyuki Goda, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 235 days.

(21) Appl. No.: 16/774,009

(22) Filed: Jan. 28, 2020

(65) Prior Publication Data
US 2020/0163258 A1 May 21, 2020

Related U.S. Application Data

(63) Continuation of application No. PCT/JP2018/027022, filed on Jul. 19, 2018.

(30) Foreign Application Priority Data

Oct. 17, 2017 (JP) .............................. JP2017-201102

(51) Int. Cl.
*H05K 9/00* (2006.01)
*H04N 5/225* (2006.01)
(Continued)

(52) U.S. Cl.
CPC .......... *H05K 9/0018* (2013.01); *G03B 17/02* (2013.01); *H04N 5/2252* (2013.01);
(Continued)

(58) Field of Classification Search
CPC ... B60R 11/04; B60R 1/12; B60R 2001/1253; B60R 2011/004; G03B 17/02;
(Continued)

(56) References Cited

U.S. PATENT DOCUMENTS

2016/0056585 A1* 2/2016 Dunwoody ........ H01R 13/6592
439/607.41
2016/0213230 A1* 7/2016 Adair ................. A61B 1/00114
(Continued)

FOREIGN PATENT DOCUMENTS

JP     2005-026021     1/2005
JP     2015-159093     9/2015

OTHER PUBLICATIONS

International Search Report of PCT application No. PCT/JP2018/027022 dated Sep. 4, 2018.

*Primary Examiner* — Amy R Hsu
(74) *Attorney, Agent, or Firm* — Greenblum & Bernstein, P.L.C.

(57) ABSTRACT

In a camera, a circuit board converts light having passed through a lens into an electric signal. A connector connects the circuit board to an outside cable. A shielding conductor surrounds the circuit board. An insulating housing houses the circuit board and the shielding conductor. A connector includes inner, intermediate, and outer connectors. The inner connector includes a first outer skin conductor, and is mounted to the circuit board. The intermediate connector includes a second outer skin conductor supporting a shielding conductor, and is connected to the inner connector and the shielding conductor. The outer connector includes a third outer skin conductor, and connects an outside cable to the intermediate connector. The shielding conductor wraps the circuit board from a boundary, as a starting point, between the second outer skin conductor and the shielding conductor. The insulating housing is connected to and supported by the intermediate connector.

15 Claims, 5 Drawing Sheets

(51) Int. Cl.
  *G03B 17/02* (2021.01)
  *H05K 7/20* (2006.01)
  *B60R 1/12* (2006.01)
  *B60R 11/04* (2006.01)
  *B60R 11/00* (2006.01)
  *H01R 12/53* (2011.01)

(52) U.S. Cl.
  CPC ....... *H04N 5/2253* (2013.01); *H04N 5/22521* (2018.08); *H05K 7/20445* (2013.01); *B60R 1/12* (2013.01); *B60R 11/04* (2013.01); *B60R 2001/1253* (2013.01); *B60R 2011/004* (2013.01); *H01R 12/53* (2013.01)

(58) Field of Classification Search
  CPC .. H01R 12/53; H04N 5/2252; H04N 5/22521; H04N 5/2253; H05K 7/20445; H05K 9/0007; H05K 9/0018
  See application file for complete search history.

(56) References Cited

U.S. PATENT DOCUMENTS

2017/0052342 A1* 2/2017 Shin .................. G02B 7/08
2017/0207589 A1* 7/2017 Wu .................. H01R 13/6591
2018/0294602 A1* 10/2018 Wu .................. H01R 12/53
2019/0103716 A1* 4/2019 Yamazaki .......... H01R 13/5202

\* cited by examiner

CAMERA

CROSS-REFERENCE TO RELATED APPLICATIONS

This application is a continuation of the PCT International Application No. PCT/JP2018/027022 filed on Jul. 19, 2018, which claims the benefit of foreign priority of Japanese patent application No. 2017-201102 filed on Oct. 17, 2017, the contents all of which are incorporated herein by reference.

BACKGROUND

1. Technical Field

The present disclosure relates to a camera, and, in particular, to a camera attached to a vehicle.

2. Description of the Related Art

In recent years, in automobile industry, sensing technology to achieve automatic driving has been actively developed. A representative image information input device is a camera. It is desired that a camera is small, and can be attached to a vehicle in a free arrangement that emphasizes a vehicle design without considering the placement distance and the direction to other electronic devices and antenna devices, in mounting the camera on the vehicle.

As a transmission method of image signals of cameras, conventional analog video signal output methods are being shifted to high-speed serial digital signal output methods capable of stably outputting high-definition image information. In camera application systems, low-noise and noise-proof designs in a high frequency range are becoming important in accordance with transmission of high-speed digital data.

Furthermore, with miniaturization of a camera, it is becoming important to take heat measures against the temperature rise inside the camera by the actual operation of an electric circuit, as well as the low-noise and noise-proof design.

Japanese Patent Unexamined Publication No. 2005-026021 (hereinafter referred as PTL 1) discloses a connection structure between a shield case and a coaxial connector for attaching a circuit board. The coaxial connector is to be mounted on a coaxial connector installation circuit board. In particular, PTL1 discloses a structure for bringing the coaxial connector into contact with the shield case using a conductive shim provided to the outer circumference of the coaxial connector.

SUMMARY

A camera according to an aspect of the present disclosure includes a lens, a circuit board, a connector, a shielding conductor, and an insulating housing. The circuit board converts light that has passed through the lens into an electric signal. The connector includes an outer skin conductor and connects the circuit board to an outside cable. The outer skin conductor includes a first outer skin conductor, a second outer skin conductor, and a third outer skin conductor. The shielding conductor surrounds the circuit board. The insulating housing houses the circuit board and the shielding conductor. The connector includes an inner connector, an intermediate connector, and an outer connector. The inner connector includes the first outer skin conductor, and is mounted on the circuit board. The intermediate connector includes the second outer skin conductor, is connected to both the inner connector and the shielding conductor. The outer connector includes the third outer skin conductor, and connects the outside cable to the intermediate connector. The shielding conductor is supported by the second outer skin conductor. The shielding conductor wraps the circuit board from a boundary, as a starting point, between the second outer skin conductor and the shielding conductor. The insulating housing is connected to and supported by the intermediate connector.

The present disclosure can achieve a camera having excellent low-noise and noise-proof performance.

DETAILED DESCRIPTION OF PREFERRED EMBODIMENTS

In the structure disclosed in PTL 1, the coaxial connector and a shield case are brought into contact with each other using a conductive shim provided to a flange of a coaxial connector. However, PTL 1 discloses nothing about an electrical contact structure and arrangement of a contact part.

In order to achieve an ideal shielding effect that achieves low-noise and noise-proof performance in a camera that transmits digital data in a high-speed, ingenuity in the contact structure, arrangement, and shape of the shield case and the connector is required.

In view of such circumstances, the present disclosure provides a camera excellent in low-noise and noise-proof performance.

Hereinafter, with reference to the drawings, specific examples of exemplary embodiments are described. Note here that the same reference marks are given to the same components having the equivalent functions, and detailed description for the components having the same reference marks are not repeated.

First Exemplary Embodiment

Figure 1A:
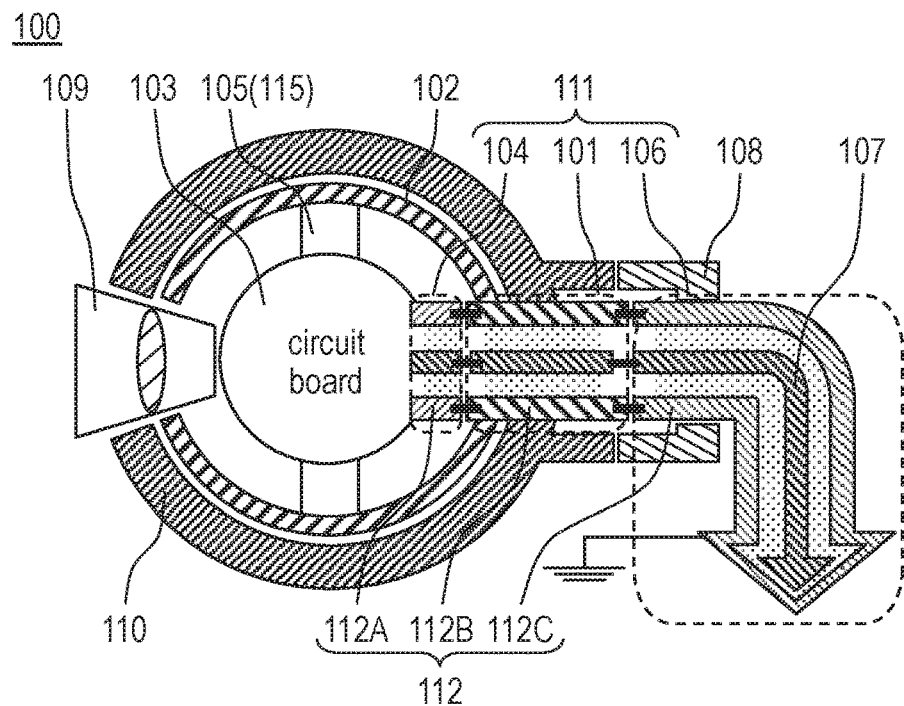
FIG. 1A is a sectional view of a camera in accordance with a first exemplary embodiment of the present disclosure.

FIG. 1A is a sectional view of camera 100 in accordance with a first exemplary embodiment of the present disclosure.

Camera 100 includes lens 109, circuit board 103, connector 111, shielding conductor 102, and insulating housing 110. Circuit board 103 converts light that has passed through lens 109 into an electric signal. Connector 111 has outer skin conductor 112, and connects circuit board 103 to an outside cable (not shown). Outer skin conductor 112 includes first outer skin conductor 112A, second outer skin conductor 112B, and third outer skin conductor 112C. Shielding conductor 102 is disposed to the outside of circuit board 103, and surrounds the circuit board 103. Insulating housing 110 houses circuit board 103 and shielding conductor 102.

Circuit board 103 has an image sensor thereon such as CCD (Charge-Coupled Device) and CMOS (Complementary Metal Oxide Semiconductor). Lens 109 is mounted on the image sensor. Light entering from lens 109 is to be collected to the image sensor on circuit board 103. Note here that lens 109 may be away (separated) from circuit board 103.

Connector 111 includes inner connector 104, intermediate connector 101, and outer connector 106. Inner connector 104 includes first outer skin conductor 112A, and is mounted to circuit board 103. Intermediate connector 101 includes second outer skin conductor 112B, is connected to inner connector 104, and is connected to shielding conductor 102. Outer connector 106 includes third outer skin conductor 112C, and connects an outside cable to intermediate connector 101. Note here that in FIG. 1A, outer connector 106 is shown in an L-shape, but it may be a straight-line shape. Furthermore, an arrow-shaped part means that outer connector 106 is to be connected to the outside cable.

In this exemplary embodiment, inner connector 104, intermediate connector 101, and outer connector 106 are all coaxial connectors.

Shielding conductor 102 is supported by second outer skin conductor 112B of intermediate connector 101. The support structure is preferably rotationally symmetric along the entirety of the periphery of second outer skin conductor 112B.

Shielding conductor 102 wraps circuit board 103, except for lens 109, from a boundary, as a starting point, where second outer skin conductor 112B and shielding conductor 102 are brought into contact with each other.

In this exemplary embodiment, shielding conductor 102 is connected to second outer skin conductor 112B on multiple points, on multiple lines, or on multiple surfaces (on a plurality of points, on a plurality of lines, or on a plurality of surfaces) at intervals along the periphery of second outer skin conductor 112B. Thus, potential of shielding conductor 102 easily becomes a common potential to second outer skin conductor 112B (for example, ground (GND) potential), and is easily stabilized.

Furthermore, it is preferable that shielding conductor 102 is connected to second outer skin conductor 112B on multiple points (on a plurality of points), on a line, or on a surface along the entirety of the periphery of second outer skin conductor 112B. In other words, the boundary where second outer skin conductor 112B and shielding conductor 102 are brought into contact with each other has a contact structure in which shielding conductor 102 is connected to second outer skin conductor 112B on multiple points (on a plurality of points), on one or more lines, or on one or more surfaces along the entirety of the periphery of second outer skin conductor 112B. Thus, potential of shielding conductor 102 easily becomes a common potential to second outer skin conductor 112B (for example, GND potential), and is easily stabilized.

Furthermore, inner connector 104 and intermediate connector 101 are connected to each other on multiple points, on multiple lines, or on multiple surfaces (on a plurality of points, on a plurality of lines, or on a plurality of surfaces) at intervals along the periphery of outer skin conductor 112. On the other hand, intermediate connector 101 and outer connector 106 are connected to each other on multiple points, on multiple lines, or on multiple surfaces (on a plurality of points, on a plurality of lines, or on a plurality of surfaces) at intervals along the periphery of outer skin conductor 112. In particular, it is preferable that inner connector 104 and intermediate connector 101 are connected to each other on multiple points or multiple lines or multiple surfaces (a plurality of points, a plurality of lines, or a plurality of surfaces) at equal intervals along the entirety of the periphery of outer skin conductor 112. Furthermore, it is preferable that intermediate connector 101 and outer connector 106 are connected to each other on multiple points, on multiple lines, or on multiple surfaces (on a plurality of points, on a plurality of lines, or on a plurality of surfaces) at equal intervals along the entirety of the periphery of outer skin conductor 112. Third outer skin conductor 112C of outer connector 106 is grounded at GND potential (zero potential) of the coaxial cable.

Figure 1B:
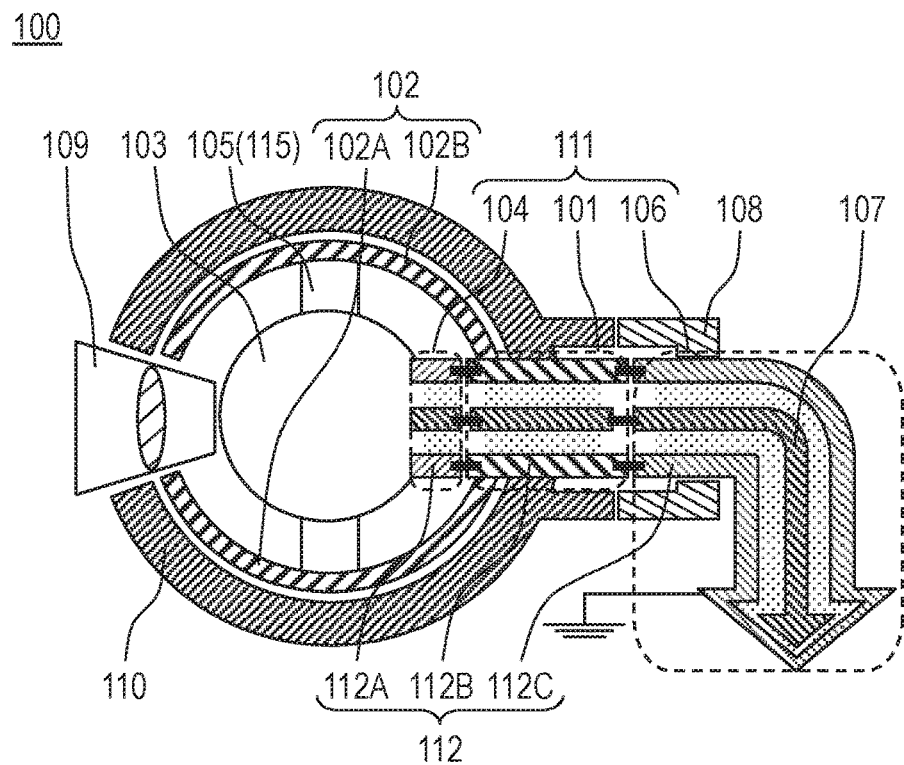
FIG. 1B is a sectional view of another camera in accordance with the first exemplary embodiment of the present disclosure.

In the example shown in FIG. 1A, shielding conductor 102 is a member unitarily formed in a shape to wrap circuit board 103; however, the shielding conductor is not limited to this configuration. As shown in FIG. 1B, shielding conductor 102 may be formed of a plurality of sub-shielding conductors 102A and 102B combined and extending toward lens 109 from the boundary, as a starting point, where second outer skin conductor 112B and shielding conductor 102 are brought into contact with each other. In this case, adjacent sub-shielding conductors 102A and 102B are connected to each other on multiple points (on a plurality of points), on one or more lines, or on one or more surfaces. Thanks to the configuration of shielding conductor 102 which is formed of the plurality of sub-shielding conductors 102A and 102B, it becomes easy to make shielding conductor 102 having a specific shape to wrap circuit board 103. As a result, the manufacturing cost of camera 100 can be reduced. Note here that the number of the sub-shielding conductors is not limited to two, and the number may be three or more.

Note here that shielding conductor 102 and second outer skin conductor 112B may be unitarily formed continuously by, for example, a squeezing method. In this case, the potential of shielding conductor 102 can be further stabilized.

Insulating housing 110 is formed of, for example, an electrically insulating resin material, and is connected to and supported by intermediate connector 101. Thus, even when camera 100 is small, insulating housing 110 can be supported stably.

In the example shown in FIG. 1A, outer connector 106 is fixed to insulating housing 110 via insulating peripheral member 108.

Furthermore, one or more (two in the example shown in the drawing) elastic heat conductors 105 for face connection are provided between circuit board 103 and shielding conductor 102. As elastic heat conductor 105, for example, Cool Sheet (registered trade mark) is used.

Alternatively, one or more elastic conductive bodies 115 for point connection, line connection, or face connection may be provided between circuit board 103 and shielding conductor 102.

Figure 2:
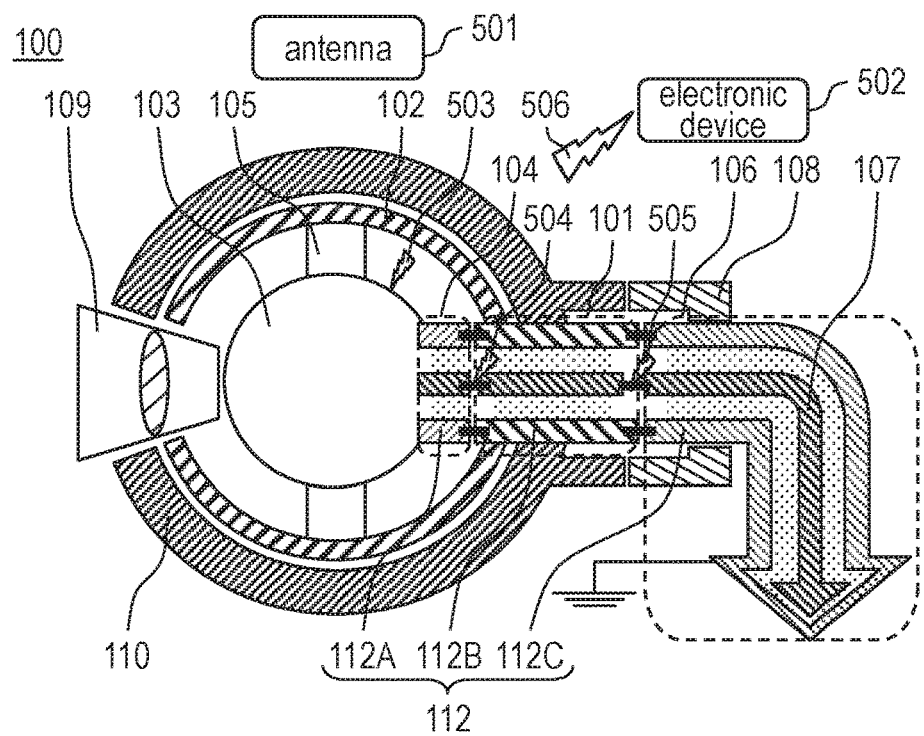
FIG. 2 is a view to illustrate an electromagnetic shielding effect achieved by the first exemplary embodiment of the present disclosure.
Figure 3:
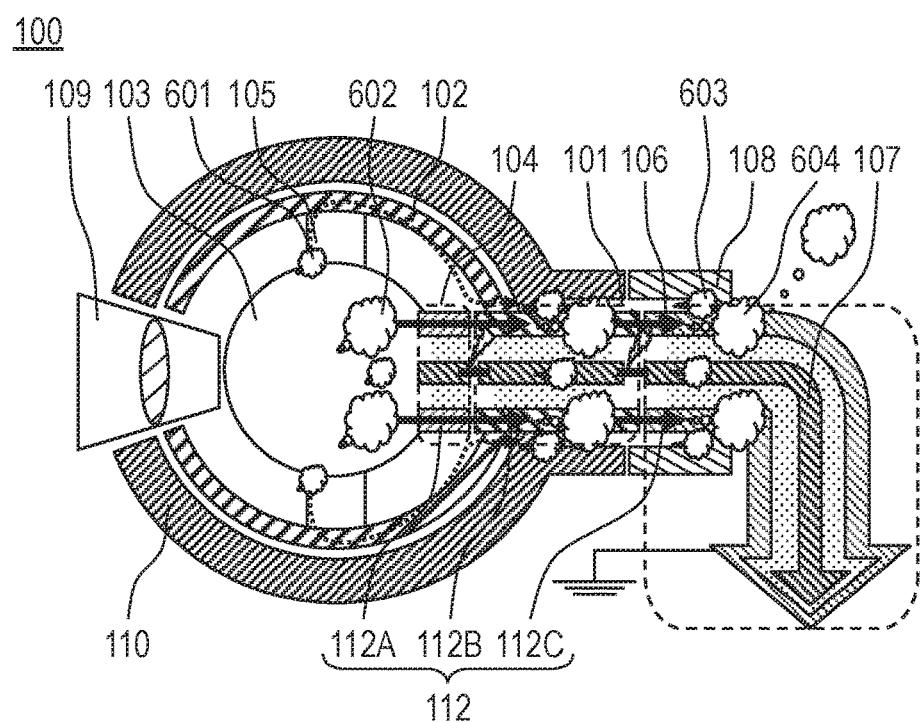
FIG. 3 is a view to illustrate an effect of dissipating heat to an outside cable, which is achieved by the first exemplary embodiment of the present disclosure.

Next, with reference to FIGS. 2 and 3, one example of an operation of camera 100 is described. FIG. 2 is a view to illustrate an electromagnetic shielding effect achieved by this exemplary embodiment. FIG. 3 is a view to illustrate an effect of dissipating heat to the outside cable, which is achieved by this exemplary embodiment.

Camera 100 is outwardly attached to, for example, a bumper, a back door, a side mirror, and the like, of a vehicle, and is used as an image information input device that is one of sensing technologies for achieving automatic driving.

Light entering lens 109 of camera 100 is collected to the image sensor of circuit board 103, and is converted into an electric signal (high-frequency signal) corresponding to color and intensity (luminance). The high-frequency signal is output to signal line 107 of outer connector 106 from circuit board 103 through inner connector 104, intermediate connector 101, and outer connector 106, sequentially.

In particular, in a vehicle, space for placing camera 100 is limited. Therefore, as shown in FIG. 2, peripheral devices such as antenna device 501 and one or more of other electronic devices 502 may be disposed in the vicinity of camera 100. In this exemplary embodiment, shielding conductor 102 wraps circuit board 103, and second outer skin conductor 112B supports shielding conductor 102. Thus, the potential of shielding conductor 102 is stabilized. Therefore, electromagnetic field noise 506 radiated from antenna device 501 and electronic device 502 toward circuit board 103 can be effectively blocked. Furthermore, an influence of an electric field outside shielding conductor 102 (external electric field noise) unlikely reaches circuit board 103 at the inner side of shielding conductor 102, so that circuit board 103 is in an electrostatically shielded state. Therefore, camera 100 has noise-proof performance. Note here that this effect is exhibited more easily when a support structure for shielding conductor 102 by second outer skin conductor 112B is rotationally symmetric along the entirety of the periphery of second outer skin conductor 112B and the potential of shielding conductor 102 is stabilized.

Furthermore, as described above, shielding conductor 102 wraps circuit board 103, and second outer skin conductor 112B supports shielding conductor 102, so that the potential of shielding conductor 102 is stabilized. Therefore, as shown in FIG. 2, electromagnetic field noise 503 radiated from circuit board 103 toward antenna device 501 and electronic device 502 can also be effectively shielded. When the potential of circuit board 103 as an internal conductor and signal line 107 is VI, and the potential of shielding conductor 102 is zero (GND) potential, at the time of actual operation of circuit board 103, all lines of electric force generated from the internal conductor end in shielding conductor 102. Consequently, even when another conductor is disposed near shielding conductor 102, no electric charge appears in the other conductor. Examples of the other conductor include a bundle of electrical wiring for another application or electronic device 502. Therefore, camera 100 has low noise, and does not have an electromagnetic effect on peripheral devices. Note here that this effect is exhibited more easily when a support structure for shielding conductor 102 by second outer skin conductor 112B is rotationally symmetric along the entirety of the periphery of second outer skin conductor 112B, and potential is stabilized.

Note here that shielding conductor 102 has an opening, and lens 109 penetrates through the opening. Alternatively, optical path of lens 109 passes through the opening. Accordingly, shielding conductor 102 cannot completely be closed due to the opening. Therefore, a high frequency noise that flows around the opening may leak out to the outside of camera 100. However, when camera 100 is used as one of sensing technologies of a vehicle, lens 109 is directed toward the outside of the vehicle and not toward electronic device 502. Therefore, leakage radiation from the opening is not a problem.

As shown in FIG. 2, when high-frequency signal components output from circuit board 103 to signal line 107 pass through connector parts having a gap or a hole, electromagnetic field noises 504 and 505, which are leakage radiation as a high frequency noise, occur. However, in camera 100, inner connector 104 and intermediate connector 101 are connected to each other on multiple points, on multiple lines, or on multiple surfaces at intervals along the periphery of outer skin conductor 112. Furthermore, intermediate connector 101 and outer connector 106 are connected to each other on multiple points, on multiple lines, or on multiple surfaces at intervals along the periphery of outer skin conductor 112. Therefore, electromagnetic field noises 504 and 505 can be distributed along the periphery and suppressed.

Furthermore, as shown in FIG. 3, inner connector 104 and intermediate connector 101 are connected to each other on multiple points, on multiple lines, or on multiple surfaces at intervals along the periphery of outer skin conductor 112. Intermediate connector 101 and outer connector 106 are connected to each other on multiple points, on multiple lines, or on multiple surfaces at intervals along the periphery of outer skin conductor 112. Consequently, even if heat is generated by actual operation of circuit board 103, heat 602 generated in circuit board 103 and transferred to inner connector 104 can be efficiently dissipated to the outside of camera 100 via intermediate connector 101 and outer connector 106. Heat 602 is transferred as heat 604 to the outside of camera 100 through inner connector 104 via intermediate connector 101 and outer connector 106.

Note here that it is more preferable that inner connector 104 and intermediate connector 101 are connected to each other on multiple points, on multiple lines, or on multiple surfaces at equal intervals along the entirety of the periphery of outer skin conductor 112, and intermediate connector 101 and outer connector 106 are connected to each other on multiple points, on multiple lines or on multiple surfaces at equal intervals along the entirety of the periphery outer skin conductor 112. With this configuration, these effects can be exhibited more easily.

Furthermore, as shown in FIG. 3, elastic heat conductor 105 can absorb heat 601 generated in circuit board 103, and dissipate heat 601 to second outer skin conductor 112B through shielding conductor 102. Heat 601 is transferred as heat 603 to outside of camera 100 through shielding conductor 102 via intermediate connector 101 and outer connector 106. Thus, even when camera 100 is small, increase of the internal temperature can be effectively suppressed.

As mentioned above, according to this exemplary embodiment, shielding conductor 102 that wraps circuit board 103 is supported by second outer skin conductor 112B. Consequently, the potential of shielding conductor 102 is stabilized to a common potential to second outer skin conductor 112B (for example, GND potential). Thus, an electromagnetic wave radiated from a peripheral device toward circuit board 103 can be effectively blocked, and an electromagnetic wave radiated from circuit board 103 toward the peripheral device can also be effectively shielded. Therefore, even in a high frequency range accompanying high-speed transmission of digital data, ideal shielding effect for achieving low-noise and noise-proofness can be achieved. Furthermore, insulating housing 110 is connected to and supported by intermediate connector 101. Thus, even when camera 100 is small, insulating housing 110 can be supported stably. Therefore, camera 100 can be attached to a vehicle in a free arrangement that emphasizes a vehicle design without considering the placement distance and the direction to electronic device 502 and antenna device 501, in mounting camera 100 on the vehicle.

Note here that in the example shown in FIG. 1A, shielding conductor 102 is supported by one surface surrounding second outer skin conductor 112B, but the configuration is not limited thereto, and may be supported by multiple points (a plurality of points), or may be supported by one or more lines or by one or more surfaces surrounding the periphery of second outer skin conductor 112B. In a case of the support structure where shielding conductor 102 is supported by second outer skin conductor 112B on multiple points, on multiple lines, or on multiple surfaces (on a plurality of points, on a plurality of lines, or on a plurality of surfaces), it is desirable that shielding conductor 102 is supported by multiple points, multiple lines, or multiple surfaces at equal intervals along the entirety of the periphery of second outer skin conductor 112B. In this case, radiated electromagnetic field noises by noise electric current flowing into second outer skin conductor 112B through shielding conductor 102 can be distributed along the periphery and suppressed.

Furthermore, lens 109 may be provided with electrically conductive mesh, or may contain electrically conductive particles (for example, carbon). In this case, even if, for example, camera 100 is placed in the interior of a vehicle, and lens 109 is directed to electronic device 502, leakage radiation from an opening of shielding conductor 102 that faces lens 109 can be effectively suppressed.

Note here that various modifications can be applied to the first exemplary embodiment. Hereinafter, with reference drawings, a modified example is described. In the following description and drawings to be used in the following description, the same reference marks are given to the same configuration as in the first exemplary embodiment, and repeated description may be omitted.

Second Exemplary Embodiment

Figure 4:
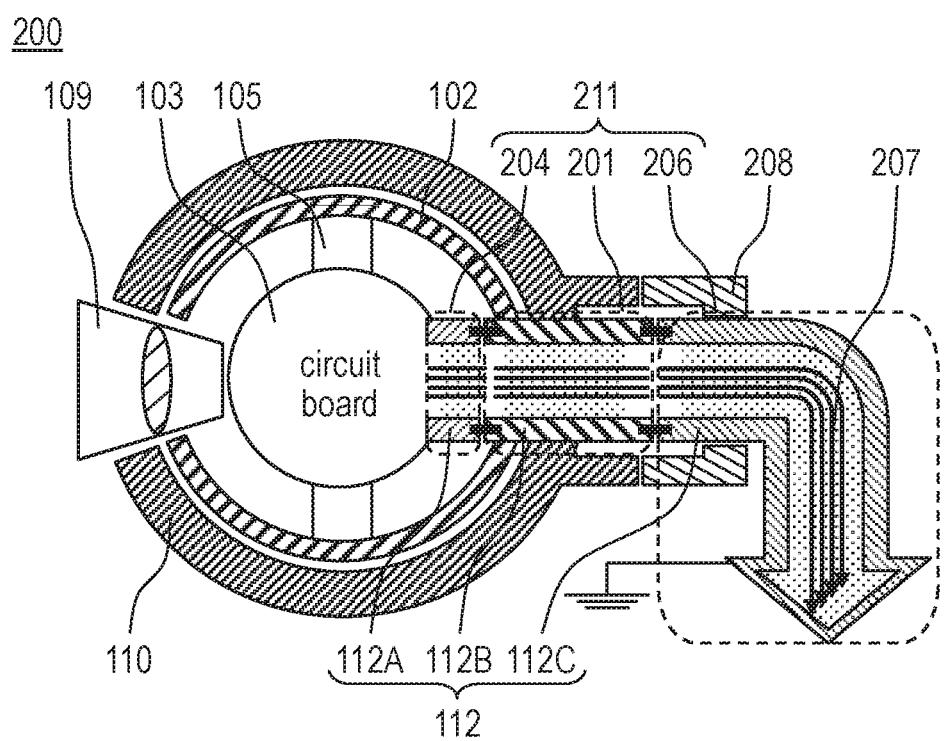
FIG. 4 is a sectional view of a camera in accordance with a second exemplary embodiment of the present disclosure.

FIG. 4 is a sectional view of camera 200 in accordance with a second exemplary embodiment of the present disclosure. Camera 200 is different from camera 100 mainly in connector 211 and signal transmission method.

Connector 211 includes inner connector 204, intermediate connector 201, and outer connector 206. Inner connector 204 is mounted to circuit board 103. Intermediate connector 201 is connected to inner connector 204, and connected to shielding conductor 102. Outer connector 206 connects an outside cable to intermediate connector 201. Note here that in FIG. 4, outer connector 206 is shown in an L-shape, but it may be a straight-line shape. Furthermore, an arrow-shaped part means that outer connector 206 is to be connected to the outside cable.

In the first exemplary embodiment, each of inner connector 104, intermediate connector 101, and outer connector 106 is a coaxial connector having one signal line 107 in outer skin conductor 112. On the other hand, in the second exemplary embodiment, inner connector 204, each of intermediate connector 201, and outer connector 206 includes a plurality of signal lines 207 inside of outer skin conductor 112.

The example shown in FIG. 4 shows inner connector 204, intermediate connector 201, and outer connector 206 each having four signal lines 207. Inner connector 204, intermediate connector 201, and outer connector 206 are, for example, connectors corresponding to STQ (Shielded Twist Quad). For example, outer skin conductor 112 is at GND potential, two signal lines corresponding to a power supply voltage and GND potential among four signal lines 207 are used in twist pair structure, the rest two signal lines corresponding to positive signal and negative signal of the differential signal are used in twist pair structure.

Inner connector 204 and intermediate connector 201 are connected to each other on multiple points, on multiple lines or on multiple surfaces at equal intervals along the entirety of the periphery of outer skin conductor 112. Furthermore, intermediate connector 201 and outer connector 206 are connected to each other on multiple points, on multiple lines, or on multiple surfaces at equal intervals along the entirety of the periphery of outer skin conductor 112. Third outer skin conductor 112C of outer connector 206 is grounded at GND potential (zero potential). Note here that similar to the first exemplary embodiment, it is only necessary that inner connector 204 and intermediate connector 201 are connected to each other on multiple points, on multiple lines, or on multiple surfaces at intervals along the periphery of outer skin conductor 112, and that intermediate connector 201 and outer connector 206 are connected to each other on multiple points, on multiple lines, or on multiple surfaces at intervals along the periphery of outer skin conductor 112.

Shielding conductor 102 is supported by second outer skin conductor 112B of intermediate connector 201. It is preferable that the support structure is rotationally symmetric along the entirety of the periphery of second outer skin conductor 112B. Also in this exemplary embodiment, it is preferable that shielding conductor 102 is connected to second outer skin conductor 112B on multiple points, on multiple lines, or on multiple surfaces along the entirety of the periphery of second outer skin conductor 112B. In other words, a boundary where second outer skin conductor 112B and shielding conductor 102 are brought into contact with each other has a contact structure in which second outer skin conductor 112B and shielding conductor 102 are connected to each other on multiple points, on one or multiple lines, or on one or multiple surfaces along the entirety of the periphery of second outer skin conductor 112B. Consequently, potential of shielding conductor 102 is stabilized to common potential to second outer skin conductor 112B (for example, GND potential). Note here that similar to the first exemplary embodiment, it is only required that shielding conductor 102 is connected to second outer skin conductor 112B on multiple points, on multiple lines, or on multiple surfaces at intervals along the periphery of second outer skin conductor 112B.

Shielding conductor 102 wraps circuit board 103, except for an opening that faces lens 109, from the boundary, as a starting point, where second outer skin conductor 112B and shielding conductor 102 are brought into contact with each other.

In this example, outer connector 206 is fixed to insulating housing 110 via insulating peripheral member 208 for connection and fixation.

Figure 5:
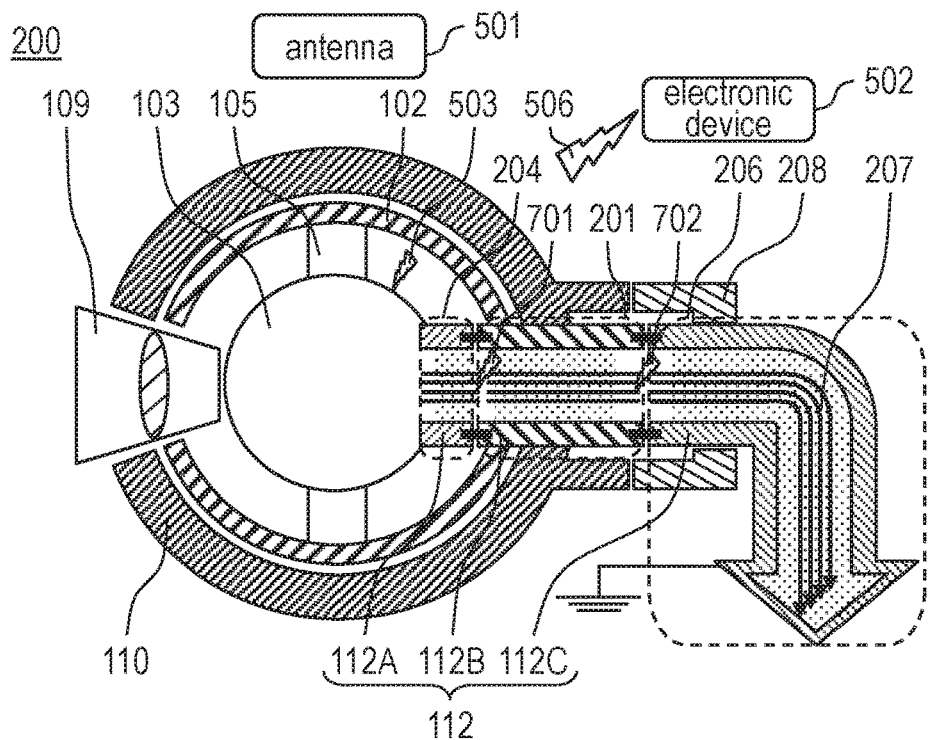
FIG. 5 is a view to illustrate an electromagnetic shielding effect achieved by the second exemplary embodiment of the present disclosure.
Figure 6:
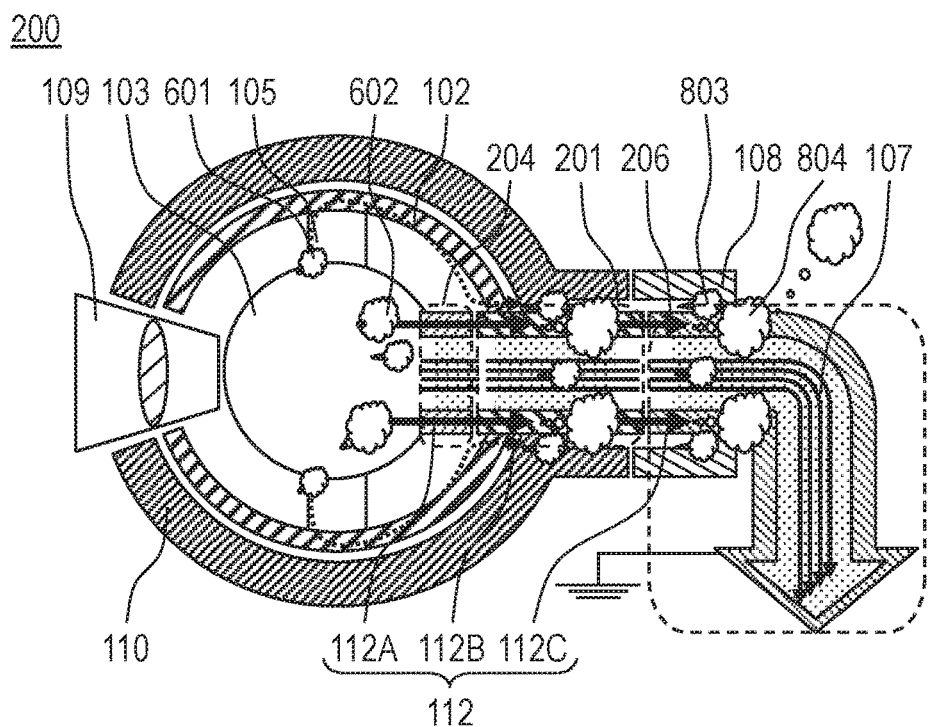
FIG. 6 is a view to illustrate an effect of dissipating heat to an outside cable, which is achieved by the second exemplary embodiment of the present disclosure.

Next, with reference to FIGS. 5 and 6, one example of an operation of camera 200 is described. FIG. 5 is a view to illustrate an electromagnetic shielding effect achieved by this exemplary embodiment. FIG. 6 is a view to illustrate an effect of dissipating heat to the outside cable, which is achieved by this exemplary embodiment.

Camera 200, similar to camera 100 of the first exemplary embodiment, is outwardly attached to, for example, a bumper, a back door, a side mirror, and the like, of a vehicle, and is used as an image information input device that is one of sensing technologies for achieving automatic driving.

Similar to camera 100, light entering lens 109 is collected to the image sensor of circuit board 103, and is converted into a high-frequency signal corresponding to color and intensity. The high-frequency signal is output to two of signal lines 207 adapted to a differential signal in outer connector 206, from circuit board 103 through inner connector 204, intermediate connector 201, and outer connector 206, sequentially.

Similar to camera 100, in particular, in a vehicle, space for placing camera 200 is limited. Therefore, as shown in FIG. 5, peripheral devices such as antenna device 501 and one or more of other electronic devices 502 may be disposed in the vicinity of camera 200. In camera 200, shielding conductor 102 wraps circuit board 103, and a support structure for shielding conductor 102 by second outer skin conductor 112B is rotationally symmetric along the entirety of the periphery of second outer skin conductor 112B, thus the potential of shielding conductor 102 is stabilized. Thus, the potential is stabilized. Therefore, electromagnetic field noise 506 radiated from antenna device 501 and electronic device 502 toward circuit board 103 can be effectively blocked. This effect is the same as in camera 100, and camera 200 has noise-proof performance.

An electromagnetic wave radiated from circuit board 103 toward antenna device 501 and electronic devices 502 can also be effectively shielded. This effect is also the same as in camera 100. Furthermore, at the time of actual operation of circuit board 103, when the potential of two signal lines 207 adapted to the differential signal and circuit board 103 as internal conductor is VI, and the potential of shielding conductor 102 is zero (GND) potential, all lines of electric force generated from the internal conductor end in shielding conductor 102. Consequently, even when the other conductor is disposed near shielding conductor 102, no electric charge appears in the other conductor. This effect is also the same as in camera 100, and therefor camera 200 has low noise.

As shown in FIG. 5, when high-frequency signal components output from circuit board 103 to signal line 207 pass through connector parts having a gap or a hole, electromagnetic field noises 701 and 702, which are leakage radiation as a high frequency noise, occur. However, inner connector 204 and intermediate connector 201 are connected to each other at equal intervals along the entirety of the periphery of outer skin conductor 112. Furthermore, intermediate connector 201 and outer connector 206 are connected to each other at equal intervals along the entirety of the periphery of outer skin conductor 112. Therefore, electromagnetic field noises 701 and 702 can be distributed along the periphery and suppressed. This effect is also the same as in camera 100.

As shown in FIG. 6, circuit board 103 generates heat by actual operation. However, inner connector 204 and intermediate connector 201 are connected to each other at equal intervals along the entirety of the periphery of outer skin conductor 112. Furthermore, intermediate connector 201 and outer connector 206 are connected to each other at equal intervals along the entirety of the periphery of outer skin conductor 112. Therefore, heat 602 generated in circuit board 103 and transferred to inner connector 204 can be efficiently dissipated to the outside of camera 200 via intermediate connector 201 and outer connector 206. Heat 602 is transferred to the outside of camera 200 as heat 804 through inner connector 204 and via intermediate connector 201 and outer connector 206.

Furthermore, elastic heat conductor 105 can absorb heat 601 generated in circuit board 103, and dissipate heat 601 to second outer skin conductor 112B of intermediate connector 201 through shielding conductor 102. Heat 601 is transferred as heat 803 to the outside of camera 200 through shielding conductor 102 via intermediate connector 201 and outer connector 106. Thus, even when camera 200 is small, increase of the internal temperature can be effectively suppressed.

As mentioned above, also according to the second exemplary embodiment, advantageous effect the same as in the first exemplary embodiment can be achieved.

Third Exemplary Embodiment

Figure 7:
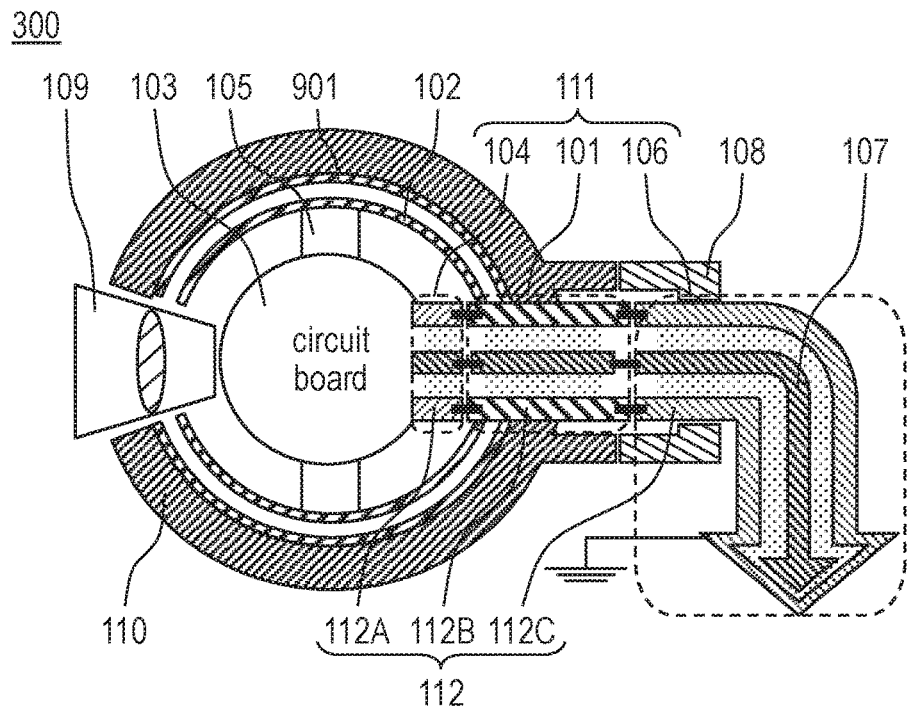
FIG. 7 is a sectional view of a camera in accordance with a third exemplary embodiment of the present disclosure.

FIG. 7 is a sectional view of camera 300 in accordance with a third exemplary embodiment of the present disclosure. In addition to the structure of camera 100, camera 300 further includes second shielding conductor 901 disposed to be overlapped to the outer side of shielding conductor 102. Second shielding conductor 901 is provided in insulating housing 110.

Second shielding conductor 901 is also supported by second outer skin conductor 112B. Furthermore, second shielding conductor 901 is connected to second outer skin conductor 112B on multiple points, on multiple lines, or on multiple surfaces (on a plurality of points, on a plurality of lines, or on a plurality of surfaces) at intervals along the periphery of second outer skin conductor 112B. Alternatively, a boundary where second outer skin conductor 112B and second shielding conductor 901 are brought into contact with each other has a contact structure in which second shielding conductor 901 is connected to second outer skin conductor 112B on a plurality of points, on one or more lines, or on one or more surfaces along the entirety of the periphery of outer skin conductor 112B. Consequently, similar to shielding conductor 102, potential of second shielding conductor 901 is stabilized to common potential to second outer skin conductor 112B (for example, GND potential). In particular, it is preferable that the support structure for second shielding conductor 901 by second outer skin conductor 112B is rotationally symmetric along the entirety of the periphery of second outer skin conductor 112B.

Furthermore, second shielding conductor 901 wraps circuit board 103 from the boundary, as a starting point, where second outer skin conductor 112B and second shielding conductor 901 are brought into contact with each other.

Note here that second shielding conductor 901 is a member unitarily formed to wrap circuit board 103, but the second shielding conductor is not limited to this. Similar to the shielding conductor in the first exemplary embodiment, the second shielding conductor may be formed of a plurality of sub-shielding conductors combined and extending from the boundary that is brought into contact with second outer skin conductor 112B, as the starting point. In this case, two adjacent sub-shielding conductors may be connected to each other on multiple points, on lines, or on surfaces. In this way, when the second shielding conductor is formed of the plurality of sub-shielding conductors, the second shielding conductor can be formed more easily as compared with the case where second shielding conductor 901 having a specific shape to wrap circuit board 103. Thus, the manufacturing cost of camera 300 can be reduced.

Note here that second shielding conductor 901 and second outer skin conductor 112B may be unitarily formed continuously by, for example, the squeezing method. In this case, the potential of second shielding conductor 901 can be further stabilized.

As mentioned above, since not only shielding conductor 102 but also second shielding conductor 901 blocks electromagnetic waves, low-noise and noise-proof performance can be enhanced in camera 300.

Fourth Exemplary Embodiment

Figure 8:
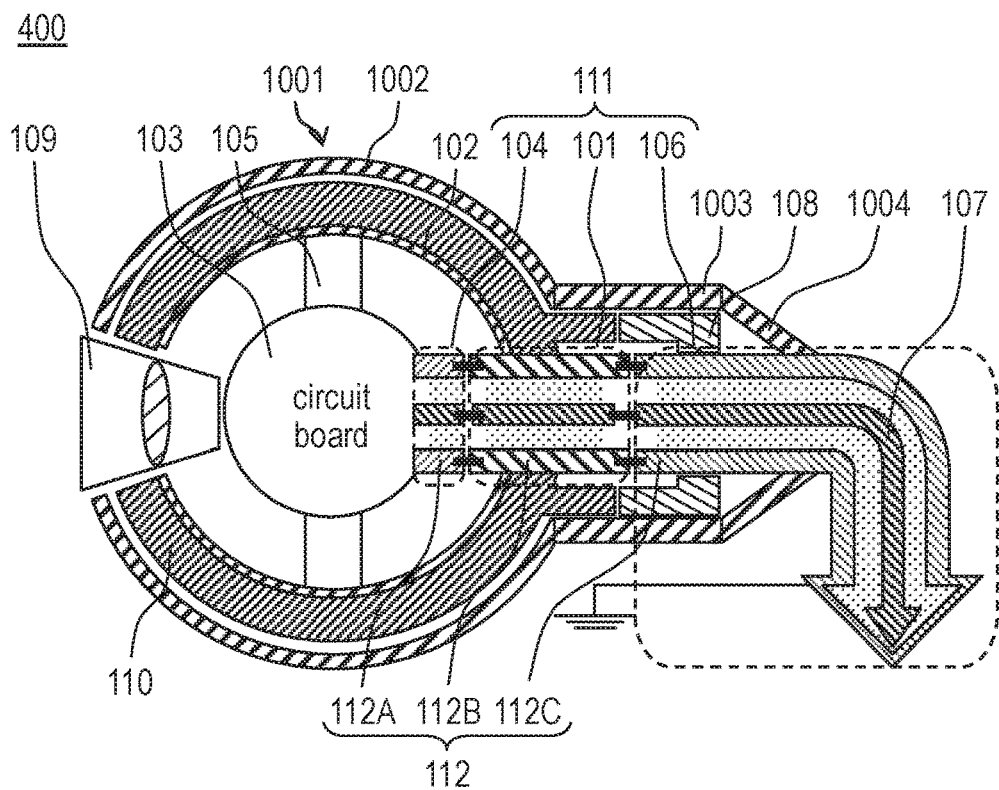
FIG. 8 is a sectional view of a camera in accordance with a fourth exemplary embodiment of the present disclosure.

FIG. 8 is a sectional view of camera 400 in accordance with a fourth exemplary embodiment of the present disclosure. Similar to camera 300 of the third exemplary embodiment, camera 400 further includes second shielding conductor 1001 disposed to be overlapped to the outer side of shielding conductor 102. However, unlike second shielding conductor 901, second shielding conductor 1001 is provided outside insulating housing 110.

Second shielding conductor 1001 is supported by third outer skin conductor 112C of outer connector 106. Second shielding conductor 1001 is connected to third outer skin conductor 112C on multiple points, on multiple lines, or on multiple surfaces (on a plurality of points, on a plurality of lines, or on a plurality of surfaces) at intervals along the periphery of third outer skin conductor 112C. Alternatively, a boundary where third outer skin conductor 112C and second shielding conductor 1001 are brought into contact with each other has a contact structure in which second shielding conductor 1001 is connected to third outer skin conductor 112C on a plurality of points, on one or more lines, or on one or more surfaces along the entirety of the periphery of third outer skin conductor 112C. Consequently, potential of second shielding conductor 1001 is stabilized to common potential to third outer skin conductor 112C (for example, GND potential). In particular, it is preferable that a support structure for second shielding conductor 1001 by third outer skin conductor 112C is rotationally symmetric along the entirety of the periphery of third outer skin conductor 112C.

Furthermore, second shielding conductor 1001 wraps circuit board 103 from the boundary, as a starting point, where third outer skin conductor 112C and second shielding conductor 1001 are brought into contact with each other.

Note here that in the example shown in FIG. 8, second shielding conductor 1001 includes sub-shielding conductors 1002, 1003, and 1004. Sub-shielding conductors 1002, 1003, and 1004 are combined to extend from the boundary, as a starting point, where third outer skin conductor 112C and second shielding conductor 1001 are brought into contact with each other, thus forming second shielding conductor 1001. Two adjacent sub-shielding conductors of sub-shielding conductors 1002, 1003, and 1004 are connected to each other on a plurality of points, on one or more lines, or on one or more surfaces. However, second shielding conductor 1001 is not limited to this, and shielding conductor 1001 may be unitarily formed in a shape to wrap circuit board 103. When sub-shielding conductors 1002, 1003, and 1004 form second shielding conductor 1001, second shielding conductor 1001 having a specific shape to wrap circuit board 103 can be easily formed. Thus, the manufacturing cost of camera 400 can be reduced.

Note here that second shielding conductor 1001 and third outer skin conductor 112C may be unitarily formed continuously by, for example, the squeezing method. In this case, the potential of second shielding conductor 1001 can be further stabilized.

As mentioned above, since not only shielding conductor 102 but also second shielding conductor 1001 blocks electromagnetic waves, low-noise and noise-proof performance can be enhanced in camera 400.

As described above, a camera according to an aspect of the present disclosure includes a lens, a circuit board, a connector, a shielding conductor, and an insulating housing. The circuit board converts light that has passed through the lens into an electric signal. The connector includes an outer skin conductor and connects the circuit board to an outside cable. The outer skin conductor includes a first outer skin conductor, a second outer skin conductor, and a third outer skin conductor. The shielding conductor surrounds the circuit board. The insulating housing houses the circuit board and the shielding conductor. The connector includes an inner connector, an intermediate connector, and an outer connector. The inner connector includes the first outer skin conductor, and is mounted to the circuit board. The intermediate connector includes the second outer skin conductor, is connected to the inner connector, and is connected to the shielding conductor. The outer connector includes the third outer skin conductor, and connects the outside cable to the intermediate connector. The shielding conductor is supported by the second outer skin conductor. The shielding conductor wraps the circuit board from a boundary, as a starting point, between the second outer skin conductor and the shielding conductor. The insulating housing is connected to and supported by the intermediate connector.

With this configuration, the shielding conductor having a shape to wrap the circuit board is supported by the second outer skin conductor. Consequently, potential of the shielding conductor is stabilized to common potential to the second outer skin conductor (for example, GND potential). Thus, electromagnetic waves radiated from the peripheral device toward the circuit board can be effectively blocked, and electromagnetic waves radiated from the circuit board toward peripheral devices can also be effectively shielded. Therefore, an ideal shielding effect capable of achieving low-noise and noise-proofness can be achieved even in a high frequency range accompanying the high-speed transmission of digital data. Furthermore, since the insulating housing is connected to and supported by the intermediate connector, even when the camera is small, the insulating housing can be supported stably.

The support structure for the shielding conductor by the second outer skin conductor may be rotationally symmetric along an entirety of a periphery of the second outer skin conductor. With this configuration, these effects can be further exhibited.

The shielding conductor may be connected to the second outer skin conductor on a plurality of points, on a plurality of lines, or on a plurality of surfaces at intervals along the periphery of the second outer skin conductor.

With this configuration, the radiated electromagnetic field noises by noise electric current flowing into the second outer skin conductor through the shielding conductor can be distributed along the periphery and suppressed.

In particular, this effect is exhibited more easily when the shielding conductor is connected to the second outer skin conductor on a plurality of points, on a plurality of lines, or on a plurality of surfaces at equal intervals along the entirety of the periphery of the second outer skin conductor. Alternatively, the shielding conductor may be connected on one line or one surface along the entirety of the periphery of the second outer skin conductor.

The inner connector and the intermediate connector may be connected to each other on a plurality of points, on a plurality of lines, or on a plurality of surfaces at intervals along a periphery of the outer skin conductor, and the intermediate connector and the outer connector may be connected to each other on a plurality of points, on a plurality of lines, or on a plurality of surfaces at intervals along the periphery of the outer skin conductor.

When high-frequency signal components output from the circuit board to the signal line pass through connector parts having a gap or a hole, leakage radiation occurs as a high frequency noise component. However, this configuration can distribute the leakage radiation along the periphery and suppress it. Furthermore, this configuration can efficiently dissipate heat, which is generated in the circuit board and transferred to the inner connector, to the outside of the camera via the intermediate connector and the outer connector.

In particular, this effect can be exhibited more easily when the inner connector and the intermediate connector are connected to each other on a plurality of points, on a plurality of lines, or on a plurality of surfaces at equal intervals along the entirety of the periphery of the outer skin conductor, and the intermediate connector and the outer connector are connected to each other on a plurality of points, on a plurality of lines, or on a plurality of surfaces at equal intervals along the entirety of the periphery of the outer skin conductor.

The shielding conductor may include a plurality of sub-shielding conductors combined to extend toward the lens from the boundary as a starting point, and two adjacent sub-shielding conductors of the plurality of sub-shielding conductors may be connected to each other on a plurality of points, on one or more lines, or on one or more surfaces.

With this configuration, the shielding conductor having a specific shape to wrap the circuit board can be easily manufactured. Thus, the manufacturing cost of the camera can be reduced.

One or more elastic conductors may be provided between the circuit board and the shielding conductor for point connection, line connection, or face connection.

This configuration can further stabilize potential of the shielding conductor, and more effectively block electromagnetic waves radiated from a peripheral device toward the circuit board, and also more effectively shield electromagnetic waves radiated from the circuit board of the camera toward the peripheral device.

One or more elastic heat conductors may be provided between the circuit board and the shielding conductor for face-connection.

This configuration can dissipate heat, which is generated inside the camera by the actual operation of the circuit board, to the outside efficiently. Thus, even when the camera is small, increase in internal temperature can be suppressed.

The shielding conductor and the second outer skin conductor may be unitarily formed continuously.

This configuration can further stabilize the potential of the shielding conductor. Thus, electromagnetic waves radiated from the peripheral device toward the circuit board can be blocked more efficiently, and electromagnetic waves radiated from the circuit board toward the peripheral device can also be shielded more efficiently.

A second shielding conductor may be disposed to be overlapped to the outer side of the shielding conductor inside the insulating housing. In this case, the second shielding conductor is connected to the second outer skin conductor on a plurality of points, on one or more lines, or on one or more surfaces along the entirety of the periphery of the second outer skin conductor, and wraps a circuit board from a boundary, as a starting point, where the second outer skin conductor and the second shielding conductor are brought into contact with each other.

According to this configuration, since not only the shielding conductor but also the second shielding conductor blocks (or shields) electromagnetic waves, low-noise and noise-proof performance of the camera can be enhanced. In particular, this effect can be exhibited easily when a support structure for the second shielding conductor by the second outer skin conductor is rotationally symmetric along the entirety of the periphery of the second outer skin conductor.

Alternatively, the second shielding conductor may be connected to the third outer skin conductor on a plurality of points, on one or more lines, or on one or more surfaces along an entirety of a periphery of the third outer skin conductor, and may wrap the circuit board from a boundary, as a starting point, where the third outer skin conductor and the second shielding conductor are brought into contact with each other. In this case, the insulating housing is disposed between the shielding conductor and the second shielding conductor.

Also with this configuration, since not only the shielding conductor but also the second shielding conductor blocks electromagnetic waves, low-noise and noise-proof performance of the camera can be further enhanced. Furthermore, although the shielding conductor has a multiple structure having a high shielding effect of electromagnetic waves, the camera can be downsized because of a good space utilization by the shielding conductor, the insulating housing, and the second shielding conductor. In particular, this effect can be exhibited easily when a support structure for the second shielding conductor by the third outer skin conductor is rotationally symmetric along the entirety of the periphery of the third outer skin conductor.

Note here that description of the exemplary embodiments and the individual modifications as well as disclosure of the drawings are merely an example for illustrating the disclosure of the claims. The disclosure of the claims is not limited by the description of the exemplary embodiments and the individual modifications and the disclosure of the drawings. The component elements of the description of the exemplary embodiments and the individual modifications can be arbitrarily combined without departing from the scope of the disclosure.

In the drawings for illustrating the above exemplary embodiments, the appearance of the camera is a round shape and the internal structural form is shown. However, the exemplary embodiment is not limited to those described above, and appropriate modifications, improvements, and the like, are possible. A general camera has a tetrahedral outer shape, but the technical point of the present disclosure does not depend on the outer shape. In addition, materials, shapes, dimensions, numbers, locations, and the like, of the respective components in the above-described exemplary embodiments are arbitrary and not limited as long as the present disclosure can be achieved.

As described above, the present disclosure can provide a small camera that can be attached to a vehicle in a free arrangement that emphasizes a vehicle design without considering the placement distance and the direction to other electronic devices and antenna devices, in mounting the camera on the vehicle.

What is claimed is:

1. A camera comprising:
 a lens;
 a circuit board configured to convert light that has passed through the lens into an electric signal;
 a connector configured to connect the circuit board to an outside cable;
 a shielding conductor surrounding the circuit board; and
 an insulating housing that houses the circuit board and the shielding conductor,
 wherein the connector includes:
  an outer skin conductor including a first outer skin conductor, a second outer skin conductor, and a third outer skin conductor;
  an inner connector having the first outer skin conductor, and mounted on the circuit board;
  an intermediate connector having the second outer skin conductor that supports the shielding conductor, connected to both the inner connector and the shielding conductor; and
  an outer connector having the third outer skin conductor, and the outer connector being configured to connect the outside cable to the intermediate connector,
 the shielding conductor wraps the circuit board from a boundary, as a starting point, between the second outer skin conductor and the shielding conductor, and
 the insulating housing is connected to and supported by the intermediate connector.

2. The camera according to claim 1,
 wherein a support structure of the second outer skin conductor for supporting the shielding conductor is rotationally symmetric along an entirety of a periphery of the second outer skin conductor.

3. The camera according to claim 1,
 wherein the shielding conductor is connected to the second outer skin conductor on a plurality of points, on a plurality of lines, or on a plurality of surfaces at intervals along a periphery of the second outer skin conductor.

4. The camera according to claim 3,
 wherein the shielding conductor is connected to the second outer skin conductor on the plurality of points, on the plurality of lines, or on the plurality of surfaces at equal intervals along an entirety of the periphery of the second outer skin conductor.

5. The camera according to claim 1,
 wherein the shielding conductor is connected to the second outer skin conductor on one line or one surface along an entirety of a periphery of the second outer skin conductor.

6. The camera according to claim 1,
 wherein the inner connector and the intermediate connector are connected to each other on a plurality of points, on a plurality of lines, or on a plurality of surfaces at intervals along a periphery of the outer skin conductor, and
 the intermediate connector and the outer connector are connected to each other on a plurality of points, on a plurality of lines, or on a plurality of surfaces at intervals along the periphery of the outer skin conductor.

7. The camera according to claim 6,
 wherein the inner connector and the intermediate connector are connected to each other on the plurality of points, on the plurality of lines, or on the plurality of surfaces at equal intervals along an entirety of the periphery of the outer skin conductor, and
 the intermediate connector and the outer connector are connected to each other on the plurality of points, on the plurality of lines, or on the plurality of surfaces at equal intervals along the entirety of the periphery of the outer skin conductor.

8. The camera according to claim 1, further comprising a plurality of sub-shielding conductors combined with each other, each of the plurality of sub-shielding conductors extending toward the lens from the boundary as a starting point,
 wherein two adjacent sub-shielding conductors of the plurality of sub-shielding conductors are connected to each other on a plurality of points, on one or more lines, or on one or more surfaces.

9. The camera according to claim 1, further comprising one or more elastic electric conductors provided between the circuit board and the shielding conductor, and connecting the circuit board to the shielding conductor by point connection, line connection, or face connection.

10. The camera according to claim 1, further comprising one or more elastic heat conductors provided between the circuit board and the shielding conductor, and connecting the circuit board to the shielding conductor by face connection.

11. The camera according to claim 1,
 wherein the shielding conductor and the second outer skin conductor are unitarily formed continuously.

12. The camera according to claim 1, further comprising a second shielding conductor disposed to be overlapped to an outer side of the shielding conductor inside the insulating housing,
 wherein the second shielding conductor is connected to the second outer skin conductor on a plurality of points, on one or more lines, or on one or more surfaces along an entirety of a periphery the second outer skin conductor, and
 the second shielding conductor wraps the circuit board from a boundary, as a starting point, where the second outer skin conductor and the second shielding conductor are brought into contact with each other.

13. The camera according to claim 12,
 wherein a support structure of the second outer skin conductor for supporting the second shielding conductor is rotationally symmetric along the entirety of the periphery of the second outer skin conductor.

14. The camera according to claim 1, further comprising a second shielding conductor disposed to be overlapped to an outer side of the shielding conductor,
 wherein the second shielding conductor is connected to the third outer skin conductor on a plurality of points, on one or more lines, or on one or more surfaces along an entirety of a periphery of the third outer skin conductor,
 the second shielding conductor wraps the circuit board from a boundary, as a starting point, where the third outer skin conductor and the second shielding conductor are brought into contact with each other, and
 the insulating housing is disposed between the shielding conductor and the second shielding conductor.

15. The camera according to claim 14,
 wherein a support structure of the third outer skin conductor for supporting the second shielding conductor is rotationally symmetric along the entirety of the periphery of the third outer skin conductor.

* * * * *